United States Patent [19]
Takemoto et al.

[11] 4,295,055
[45] Oct. 13, 1981

[54] CIRCUIT FOR GENERATING SCANNING PULSES

[75] Inventors: Iwao Takemoto, Kodaira; Norio Koike, Tokyo; Shinya Ohba; Haruhisa Ando, both of Kokubunji; Masaaki Nakai, Hachioji; Syoji Hanamura; Ryuichi Izawa, both of Kokubunji; Masaharu Kubo; Masakazu Aoki, both of Hachioji; Shuhei Tanaka, Higashiyamato, all of Japan

[73] Assignees: Hitachi, Ltd.; Hitachi Denshi Kabushiki Kaisha, both of Tokyo, Japan

[21] Appl. No.: 46,028

[22] Filed: Jun. 6, 1979

[30] Foreign Application Priority Data

Jun. 12, 1978 [JP] Japan ................................. 53/69793

[51] Int. Cl.³ ........................................... H03K 21/00
[52] U.S. Cl. ............................. 307/221 C; 307/223 C
[58] Field of Search ....................... 307/221 C, 223 C

[56] References Cited

U.S. PATENT DOCUMENTS

| 3,575,610 | 4/1971 | Okuba | 307/223 C |
| 3,576,447 | 4/1971 | McKenny | 307/221 C |
| 3,731,114 | 5/1973 | Gehweiler | 307/221 C |
| 3,794,856 | 2/1974 | Baker | 307/221 C |

Primary Examiner—Harold A. Dixon
Attorney, Agent, or Firm—Craig and Antonelli

[57] ABSTRACT

A circuit for generating scanning pulses comprising a plurality of stages of basic circuits connected in series, said each basic circuit comprising first, second and third insulated gate field-effect transistors (MISTs) each of which has first and second terminals each being either of source and drain terminals and a gate terminal, said first terminal of said first MIST being used as a clock pulse-applying terminal, said gate terminal of said first MIST being used as an input terminal, said second terminal of said first MIST and said first terminal and said gate terminal of said second MIST being connected and used as a scanning pulse output terminal, said second terminal of said second MIST and said first terminal of said third MIST being connected and used as an output terminal, said second terminal of said third MIST being used as a ground terminal, said gate terminal of said third MIST being used as a feedback input terminal.

29 Claims, 31 Drawing Figures

CIRCUIT FOR GENERATING SCANNING PULSES

BACKGROUND OF THE INVENTION (1) Field of the Invention

This invention relates to a circuit for generating scanning pulses, and more particularly to a circuit for generating scanning pulses which is constructed of a semiconductor integrated circuit. Further, this invention pertains to a pulse generator which generates pulses for selectively scanning sequentially and digitally a large number of photoelectric conversion elements disposed in an optical reader, a photosensor array of a facsimile, a solid-state imager, etc., especially to such scanning pulse generator which is constructed of an integrated circuit composed of MIS (Metal-Insulator-Semiconductor) insulated gate field-effect transistors etc.

(2) Description of the Prior Art

Heretofore, as a circuit for generating scanning pulses, there has been extensively utilized a shift register type scanning circuit wherein in order to sequentially scan a large number of photoelectric conversion elements in a linear or array arrangement, input pulses are delayed a fixed time and then delivered in succession by the use of two or more phases of clock pulses as illustrated in FIG. 1A. This figure is a circuit diagram of the first three stages of the shift register type scanning circuit employing MIS insulated gate field-effect transistors (hereinbelow, abbreviated to "MISTs").

Blocks $G_1$ and $G_2$ are generators for clock pulses $\phi_1$ and $\phi_2$ respectively, and a block $G_3$ is a generator for input pulses $V_{IN}$. $V_D$ indicates a D.C. power supply for drive, and $V_S$ indicates a reference voltage terminal which usually applies the earth voltage. Transistors $Q_1$ and $Q_2$ are load MISTs of the saturation mode which are formed by connecting the gates and drains thereof. Transistors $Q_3$ and $Q_4$ are driver MISTs. A circuit in which the source of the MIST $Q_1$ and the drain of the MIST $Q_3$, or the source of the MIST $Q_2$ and the drain of the MIST $Q_4$ are combined in series operates as an inverter. Transistors $Q_5$ and $Q_6$ are transfer MISTs.

Although the following description will be made by taking N-channel MISTs as an example and employing the positive logic (in which a positive high voltage is expressed by "1" and the earth voltage by "0"), quite the same applies to P-channel MISTs by inverting the signs of voltages. The input pulse $V_{IN}$ which is applied to the first stage inverter by the input pulse generator $G_3$ is delayed a fixed time decided by the clock pulses $\phi_1$ and $\phi_2$, every passage through each stage by the transfer MISTs which are alternately turned "on" and "off" by the clock pulses $\phi_1$ and $\phi_2$. The delayed pulses appear at output terminals $V_{o1}$, $V_{o2}$ and $V_{o3}$ of the respective stages as illustrated in timing diagram of FIG. 1B.

The shift register type scanning circuit utilizing the MISTs is suited to a semiconductor integrated circuit in such a point that all the circuit elements can be fabricated of the MISTs and that the fabricating process is comparatively simple. The density of integration and the available percentage are also enhanced easily. Since the operating margin is high and the deviations of the characteristics of the respective stages are small, the foregoing scanning circuit is very excellent as a scanning circuit which requires many stages of outputs.

The scanning circuit above described, however, has the following disadvantages:

①Current flows through one of two stages of inverters at all times, so that the power dissipation is high.

②Notwithstanding that the drivability of a load is determined by the MIST $Q_2$ (or $Q_1$), the channel width of the driver transistor MIST $Q_4$ (or $Q_3$) (accordingly, the size of the transistor) must be made large, so that a large area is occupied. More specifically, the output offset voltage becomes:

$$V = V_D \times \frac{g_m(Q_2)}{g_m(Q_4)} \doteqdot V_D \frac{L_2}{L_4}$$

where
  $V_D$: supply voltage,
  $g_m(Q_2)$: conductance of MIST $Q_2$,
  $g_m(Q_4)$: conductance of MIST $Q_4$,
  $L_2$: channel width of MIST $Q_2$,
  $L_4$: channel width of MIST $Q_4$.

In order to make the offset small, the channel width $L_4$ of the MIST $Q_4$ must be made great, so that the area of the MIST $Q_4$ increases.

③The output signal voltage swing is small as compared with the supply voltage. The "0" level of the output does not become the ground potential (it becomes approximately $V_D \cdot g_m(Q_2)/g_m(Q_4)$), and the "1" level of the output does not become the potential of the power supply, either.

④The deviation of the threshold voltage of the MIST $Q_4$ has great influence.

Besides the scanning circuit shown in FIG. 1A, a shift register constructed of complementary MISTs (CMOS) has been devised. According to the CMOS circuit, the operating speed is high and the power dissipation is low, and the number of constituent elements per stage decreases. However, N-channel MISTs and P-channel MISTs must be integrated, and the manufacturing process becomes complicated. It is therefore desirable to construct the scanning circuit by the use of MISTs of either channel.

As still another type of scanning circuit, there has been known one which exploits the bootstrap effect of MISTs. FIG. 2A shows the scanning circuit exploiting the bootstrap effect as proposed by N. Koike being the inventor of this invention (refer to U.S. Ser. No. 764,841 filed Feb. 2, 1978 and German laid-open Pat. No. 2705429).

In FIG. 2A, $Q_{10}$ indicates a MIST which serves to transfer an input pulse (level "1" or "0") supplied from an input pulse generator $G_3$, under the control of a clock pulse; $Q_{11}$ a charging MIST which is connected on the output side of the transfer MIST $Q_{10}$ and which serves to deliver a scanning output pulse to an output side terminal $V_{01}$ under the control of another clock pulse; and $Q_7$ a discharging MIST which is connected between the output side of the charging MIST $Q_{11}$ and an earth line and which serves to discharge charges stored in an output terminal circuit.

On the other hand, a driving MIST $Q_8$ and a load MIST $Q_9$ are connected in cascade between a power supply line $V_D$ and the earth line, and the gate of the discharging MIST $Q_7$ is connected to the node $N_1$ between both the MISTs $Q_8$ and $Q_9$. The node $N_2$ between the transfer MIST $Q_{10}$ and the charging MIST $Q_{11}$ is connected to the gate of the driving MIST $Q_8$. $C_B$ indicates a bootstrap capacitance which is connected between the source and gate of the charging MIST $Q_{11}$.

FIG. 2B shows a timing chart of the clock pulses $\phi_1$ and $\phi_2$, the input pulse $V_{IN}$ and pulses at the node $N_2$, the output terminal $V_{01}$ and the node $N_1$.

The scanning circuit of FIG. 2A is such that a unit circuit is made up of the five MISTs $Q_7$, $Q_8$, $Q_9$, $Q_{10}$ and $Q_{11}$ and that the basic circuits are connected into many stages. FIG. 2C shows a timing chart of the clock pulse $\phi_1$ and $\phi_2$, the input pulse $V_{IN}$ and output pulses $V_{01}$, $V_{02}$ and $V_{03}$.

This scanning circuit exploiting the bootstrap effect of MISTs has the advantage that a continuous current to hold the state of an inverter being otherwise existent can be removed, so the power dissipation is reduced. However, it has the disadvantage that noise in the bandwidth are prone to occur on account of the difference of the waveforms of the clock pulses $\phi_1$ and $\phi_2$ (attributed to the difference of pulse shaping units). The scanning circuit of FIG. 2A requires the five MISTs and one bootstrap capacitance of sufficiently large capacity as the fundamental constituent elements per stage and has not its construction simplified very much, so that a difficulty remains in point of the density of integration yet.

As the scanning circuit exploiting the bootstrap effect, there has also been one which is disclosed in U.S. Pat. No. 3,829,711. It also requires five MISTs as constituent elements per stage, which forms a difficulty in point of the density of integration.

SUMMARY OF THE INVENTION

This invention has for its object to provide a circuit for generating scanning pulses which has a simple construction and requires a small number of constituent elements per stage.

Another object of this invention is to provide a circuit for generating scanning pulses which employs no inverter circuit and which is of low power dissipation.

Another object of this invention is to provide a circuit for generating scanning pulses which generates uniform output pulses free from fluctuations attributed to deviations of constituent elements (MISTs) or deviations of clock pulses.

Another object of this invention is to provide a circuit for generating scanning pulses which generates discrete scanning pulses synchronous with one clock pulse by means of a simple construction.

In order to accomplish the objects, according to a scanning pulse generator circuit of this invention, a scanning pulse generator circuit exploiting the bootstrap effect of MISTs is improved so as to make it possible to construct a basic circuit with a smaller number of elements. The scanning pulse generator circuit of this invention is made up of at least three MISTs, among which the first MIST produces a scanning pulse owing to the bootstrap effect, the second MIST transfers an input pulse to the succeeding stage of basic circuit, and the third MIST receives a feedback output from a basic circuit posterior by two stages and thus carries out a reset operation.

DETAILED DESCRIPTION OF THE INVENTION

This invention consists in a semiconductor device in which a dynamic scanner (shift register) is constructed by exploiting the bootstrap effect of MISTs.

Figure 3A:
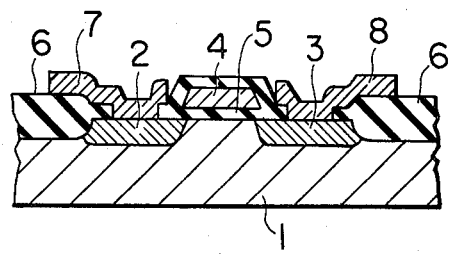
FIGS. 3A and 3C are structural sectional views of MOSTs.
Figure 3B:
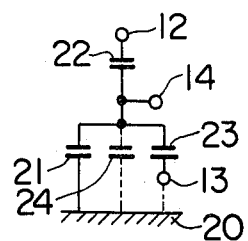
FIGS. 3B and 3D are equivalent circuit diagrams for explaining parasitic capacitances of the MOSTs.
Figure 3C:
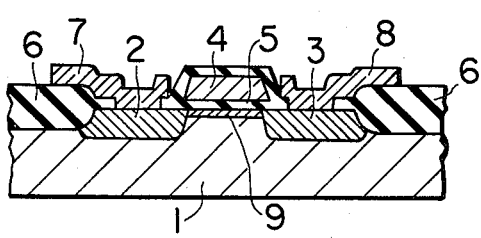
Figure 3D:
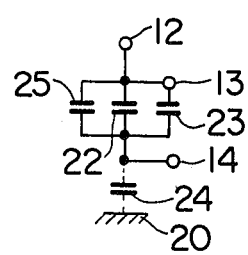

Hereunder, the bootstrap effect exploited in the scanning pulse generator circuit of this invention will be described in connection with an N-channel MOS (Metal-Oxide-Semiconductor) type insulated gate field-effect transistor (hereinbelow, abbreviated to MOST) in which signal charges are electrons and which employs an $SiO_2$ film as a gate insulating film. In FIGS. 3A and 3B, numeral 1 designates a silicon substrate of the P-type conductivity, numerals 2 and 3 N-type diffused layers to serve as a drain and a source respectively, numeral 4 a gate electrode, numeral 5 a gate insulating film (of, for example, $SiO_2$), numeral 6 a field oxide film (of, for example, $SiO_2$), numerals 7 and 8 drain and source electrodes respectively, and numeral 9 an N-type inversion layer. In FIG. 3A, when the gate electrode 4 is at 0 (zero) V, no inversion layer is formed in the surface of the P-type Si substrate 1 underlying the gate oxide film 5. When a positive voltage (of over the threshold voltage $V_{th}$ of the MOST) is applied to the gate electrode 4, the N-type inversion layer 9 is formed as illustrated in FIG. 3C, and the N-type diffused layers 2 and 3 are electrically connected. By way of example, the capacitive coupling between the N-type diffused layer 2 and the gate electrode 4 is illustrated in FIGS. 3B and 3D.

When the gate electrode 4 is at 0 V, the coupling capacitance between a terminal 12 corresponding to the N-type diffused layer 2 and a terminal 14 corresponding to the gate electrode 4 consists only of a capacitance 22 ascribable to their structural overlap. As parasitic capacitances which suppress the effect of this capacitive coupling, the terminal 14 has an overlap capacitance 21 between the gate electrode 4 substantially joining to the ground 20 and the P-type Si substrate 1, an overlap capacitance 23 between the gate electrode 4 and the N-type diffused layer 3 indicated by a terminal 13, and a parasitic capacitance 24 of the other parts connecting with the gate electrode (FIG. 3B).

On the other hand, in case where the positive voltage ($>V_{th}$) is applied to the gate electrode 4, the capacitive coupling between the gate electrode 4 (terminal 14) and the N-type diffused layer 2 (terminal 12) includes, besides the capacitance 22, the sum of a capacitance 25 between the gate electrode and the inversion layer 9 to replace the capacitance 21 and the overlap capacitance 23 between the gate electrode and the N-type diffused layer 3 (terminal 13). It is only the parasitic capacitance 24 that joins to the ground 20. The capacitances 22 and 23 are usually equivalent. The capacitances 21 and 25 are also substantially equal, and ordinarily they have a value nearly one order greater than the capacitance 22.

Accordingly, the junction capacitance between the N-type diffused layer 2 and the gate electrode 4 has the nature of a varactor capacitance which varies greatly depending upon the voltage applied to the gate electrode 4. It brings forth the bootstrap-like effect that when the positive voltage is applied to the gate electrode 4 in advance, the impression of a positive pulse on the N-type diffused layer 2 raises the voltage of the gate electrode 4 more.

Figure 4A:
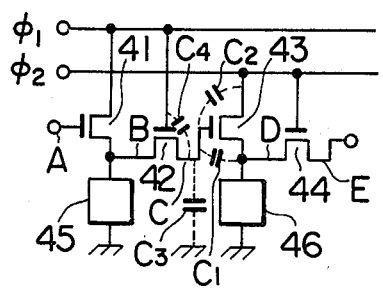
FIG. 4A is a circuit diagram for explaining the principle of a circuit for generating scanning pulses which utilizes the bootstrap effect of MISTs.
Figure 4B:
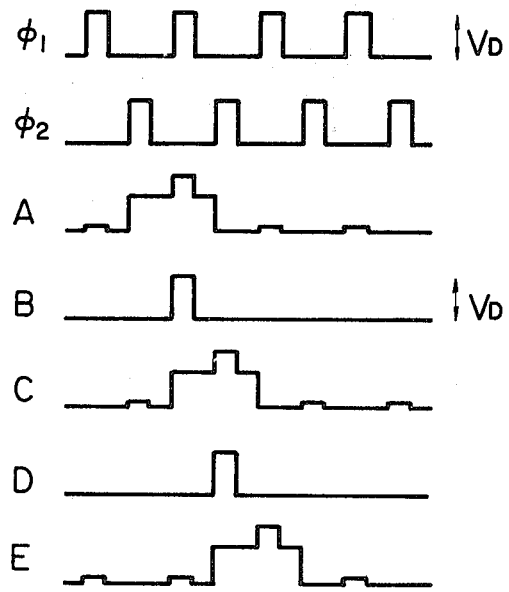
FIG. 4B is a pulse timing chart showing potential changes at various nodes in the circuit of FIG. 4A.

This invention consists in a circuit for generating scanning pulses which utilizes the property of the varactor capacitance, and the principle thereof is illustrated in FIGS. 4A and 4B. FIG. 4A shows two stages which correspond to a basic circuit, while FIG. 4B shows a pulse timing chart of principal points A–E. Loads 45 and 46 may be any of resistances, capacitances or a combination thereof. When, in case where the voltage of the point C is made positive in advance, a clock pulse $\phi_2$ becomes positive, the voltage of the point C is greatly pushed up and a MOST 43 applies the clock pulse $\phi_2$ to the load 46 under a non-saturation condition.

Design conditions may fulfill the following. Assuming by way of example that the voltage drop of the point C at the time when the point B has become positive is $\Delta V$ ($=V_{th}+K\sqrt{V_D-V_{th}}$; $V_D$: amplitude of $\phi_1$ and $\phi_2$, K: body effect constant).

$$\frac{(C_1 + C_2) V_D}{C_1 + C_2 + C_3 + C_4} \geq \Delta V \tag{1}$$

$$\frac{C_2 V_D}{C_1 + C_2 + C_3 + C_4} \leq V_{th} \tag{2}$$

In case where the loads 45 and 46 are low, a capacitance or high resistance (on the order of $10^5$–$10^7$ Ω in ordinary IC element dimensions and uses) is connected in parallel therewith or a MOST which can cause a small amount of current to flow steadily or intermittently by applying a D.C. voltage or intermittent voltage to its gate electrode is disposed in parallel therewith, and it may be jointly handled as the load.

The scanning pulse generator circuit of this invention utilizes the bootstrap effect, and is therefore very simple in construction. It does not require the driver MOST being disproportionately large in comparison with the load as in the conventional inverter, and it is suited to an integrated circuit. It is of low power dissipation. In addition, since the applied pulses $\phi_1$ and $\phi_2$ are impressed on the loads as they are, the fluctuations of the pulses to be impressed on the loads as ascribable to the deviations of the characteristics of the MOSTs constituting the generator circuit, for example, the deviations of the threshold voltages $V_{th}$ do not occur, and the lowering of the amplitude does not occur, either. Especially in case where the scanning pulse generator circuit is applied to analog devices, for example, an image device such as solid-state imager and frame memory, noise can be conspicuously lowered. As compared with the prior-art circuit for generating scanning pulses which utilizes the bootstrap effect, the circuit for generating scanning pulses according to this invention can reduce the number of constituent elements and lessen the development of noise. Further, the potentials of the various points in the circuit can be easily reset to 0 (zero).

Hereunder, this invention will be described in detail with reference to embodiments.

EMBODIMENT 1

Figures 5A, 5B:
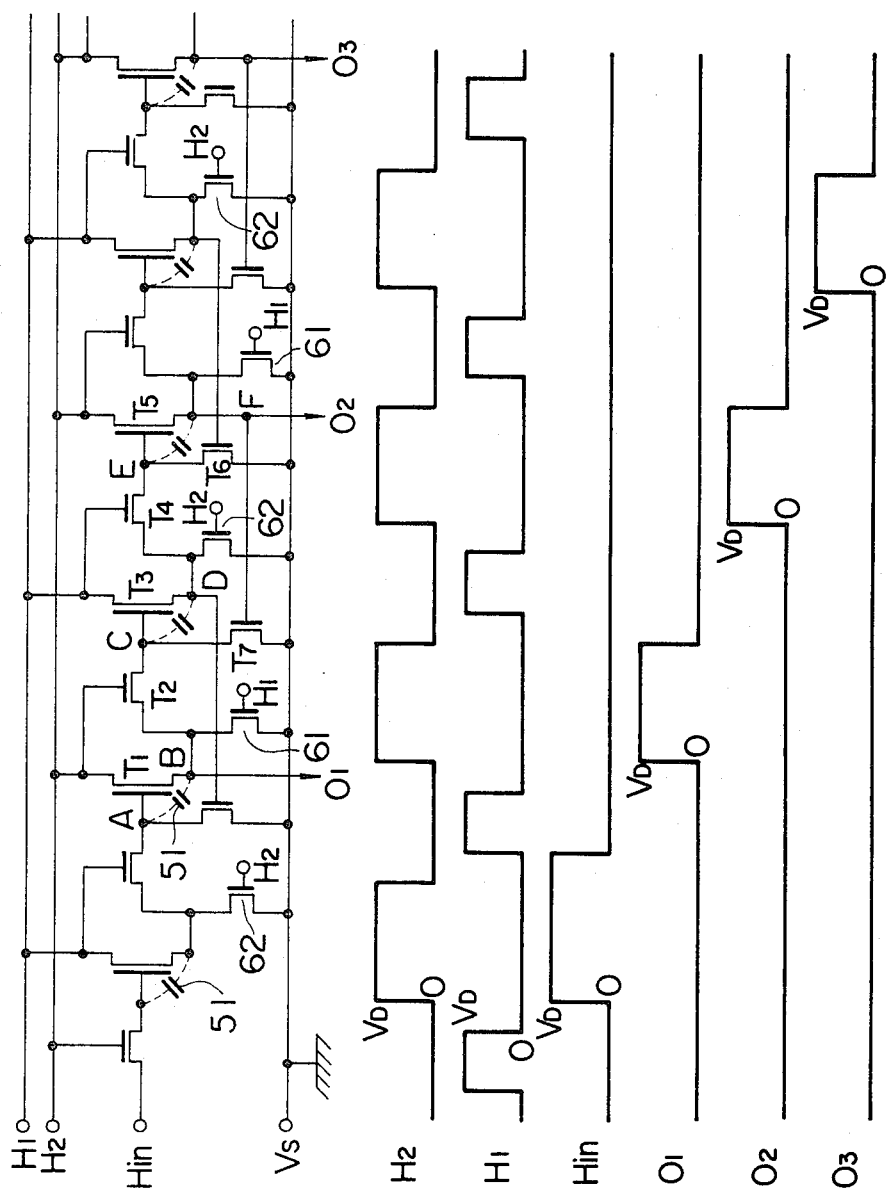
FIG. 5A is a circuit diagram showing a first embodiment of a scanning pulse generator circuit according to this invention.
FIG. 5B is a pulse timing chart showing clock pulses, an input pulse and output pulses in the circuit of FIG. 5A.

A circuit shown in FIG. 5A is an embodiment of the scanning pulse generator circuit of this invention. In FIG. 5B, $H_1$ and $H_2$ indicate synchronizing (clock) pulses, $H_{in}$ an input pulse, and $O_1$, $O_2$ and $O_3$ output pulses with which, for example, switching MIS transistors for horizontal scanning in a solid-state imager are switched. $V_S$ in FIG. 5A designates the earth.

In FIG. 5A, it is now supposed that a point A is at a high level (hereinbelow, shortly written "H"). When the synchronizing pulse $H_2$ is subsequently applied (it becomes "H"), the potential of a node B rises through a MOST $T_1$. The potential of the node A rises above a pulse amplitude $V_D$ through a bootstrap capacitance 51 between the nodes A and B (although this capacitance may be the parasitic capacitance of the MOST described previously, a capacitive element such as condenser may well be externally added, and the same applies to various embodiments of this invention to be stated below), and the MOST $T_1$ comes to operate in a non-saturation region. Accordingly, the pulse $O_1$ having quite the same waveform as that of the synchronizing pulse $H_2$ is provided at the node B. At this time, a MOST $T_2$ turns "on" simultaneously, and hence, "H" is written into a node C. This potential becomes substantially equal to a value obtained by subtracting the threshold voltage of the MOST $T_2$ from the pulse amplitude $V_D$.

When the pulse $H_1$ subsequently becomes "H", MOSTs $T_3$ and $T_4$ turn "on", and "H" is written into a node E for the same reason as stated before.

Further, when the pulse $H_2$ subsequently becomes "H", the pulse $O_2$ is similarly provided at a node F. At this time, also the MOST $T_2$ turns "on". Since "H" has been written in the node C, charges stored therein flow back to the node B, the nodes B and C tend to become equal potentials, and the potential of the node B rises from 0 towards a positive value.

In, for example, the solid-state imager, as regards horizontal output pulses, unless the pulse appears only once and the zero potential is thereafter held as depicted in FIG. 5B, noise will increase. A MOST $T_7$ is a transistor for clearing the potentials of the nodes B and C into zero. Since the node F lying at the high level is connected to the gate, the MOST $T_7$ turns "on", and the nodes B and C are held fixed to the zero potential. A transistor $T_6$ has the same function as that of the transistor $T_7$, and clears nodes E and D into the zero potential.

Figure 1A:
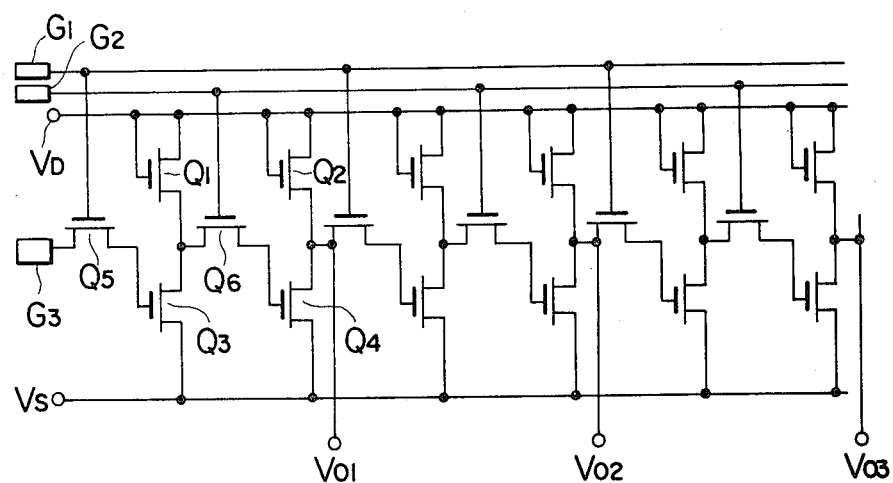
FIG. 1A is a circuit diagram of a prior-art circuit for generating scanning pulses which employs inverter circuits.
Figure 1B:
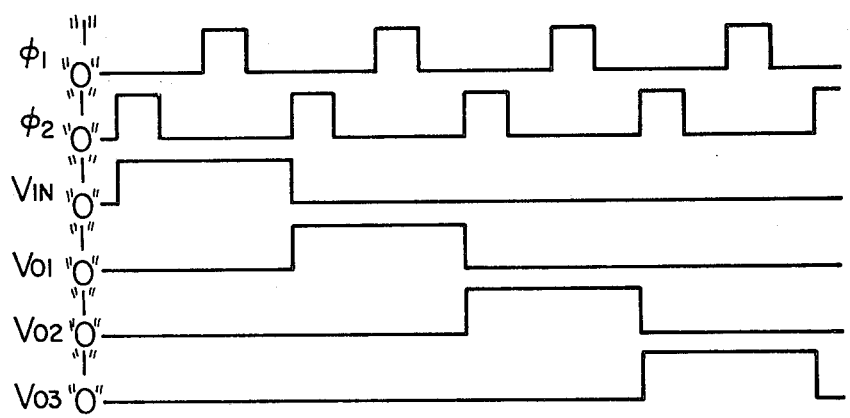
FIG. 1B is a timing diagram showing clock pulses and output pulses in the circuit of FIG. 1A.
Figure 2A:
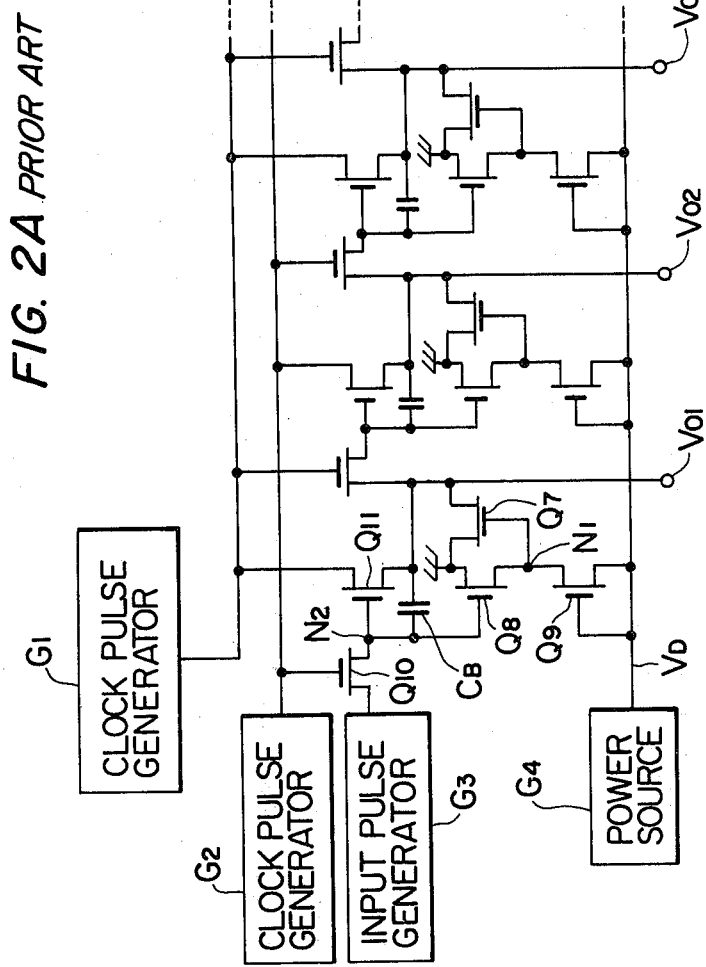
FIG. 2A is a circuit diagram of a prior-art circuit for generating scanning pulses which utilizes the bootstrap effect of MISTs.
Figure 2B:
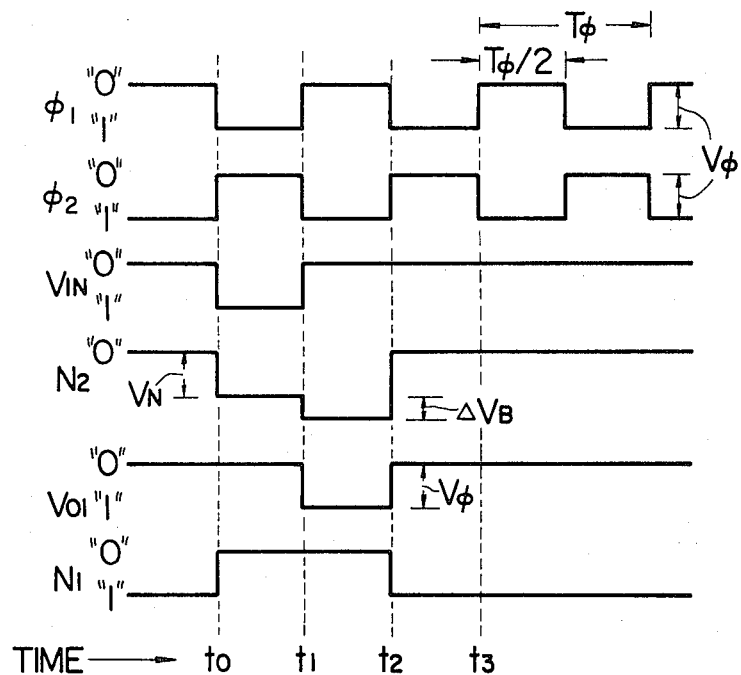
FIG. 2B is a timing diagram showing clock pulses, an input pulse, and potential changes at nodes $N_1$ and $N_2$ and an output terminal $V_{01}$ in the circuit of FIG. 2A.
Figure 2C:
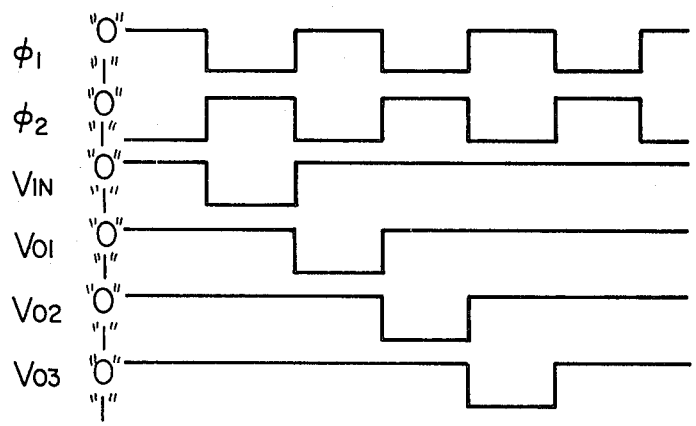
FIG. 2C is a timing diagram showing clock pulses, and input and output pulses in the circuit of FIG. 2A.

The basic circuit of the scanning pulse generator circuit in FIG. 5A is constructed of three MOSTs (for example, MOSTs $T_3$, $T_4$ and $T_6$), and the nodes for deriving the output pulses are B, D, F . . . . In FIG. 5A, accordingly, the output is derived every second stage, and discrete pulses synchronized with the clock pulses $H_2$ as shown by the output pulses $O_1$, $O_2$, $O_3$ . . . in FIG. 2B are obtained.

In the circuit shown in FIG. 5A, no current flows D.C.-wise, so that the power dissipation is as low as in case of using CMOS. In addition, all the elements may be N-channel MOSTs.

In the circuit shown in FIG. 5A, resetting transistors 61 and 62 are connected to the output points B, D, F . . . . Owing to the reset transistors, the operation becomes more reliable. Even when the reset transistors are incorporated, the pitch of the shift register is not adversely affected at all.

Figure 6:
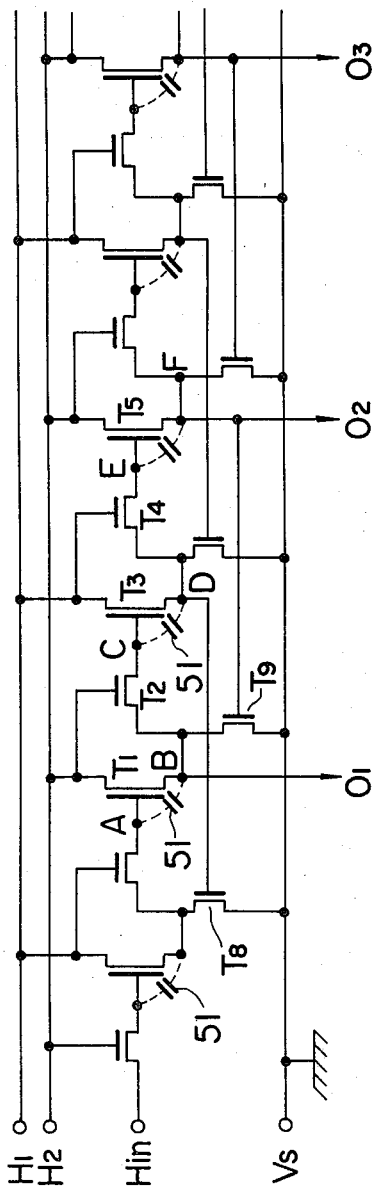
FIG. 6 is a circuit diagram showing a modification of the circuit of FIG. 5A.

FIG. 6 shows a modification of the embodiment in FIG. 5A, and it somewhat differs in the point of executing feedback. In FIG. 5A, the potential of the point F is fed back to the point C, whereas in FIG. 6, it is fed back to the point B in FIG. 5A (feedback MOSTs: $T_8$, $T_9$).

Conversely, in FIG. 6, the point B receives feedback from the point F, but it may receive feedback from the point E without any hindrance in the principle of this invention.

EMBODIMENT 2

Figure 7:
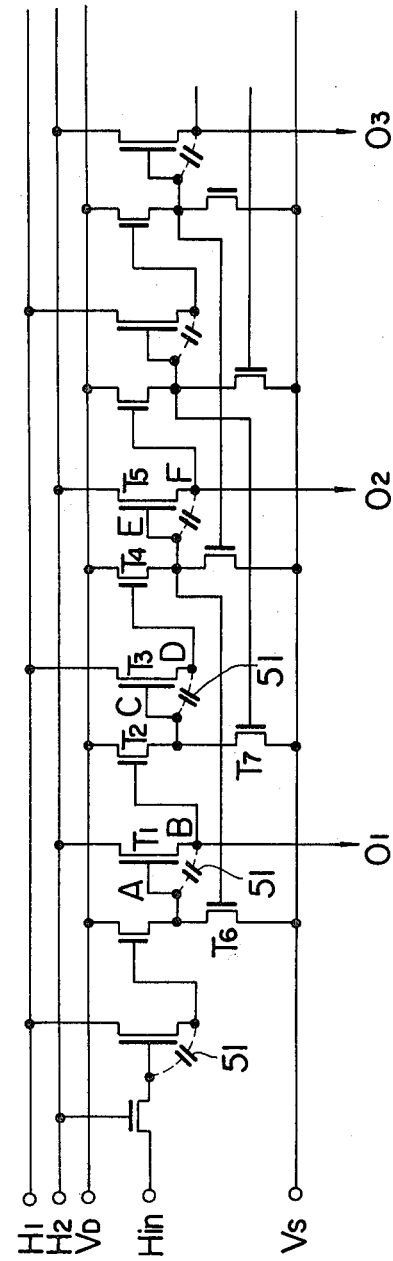
FIG. 7 is a circuit diagram showing a second embodiment of the scanning pulse generator circuit according to this invention.

FIG. 7 shows another embodiment of this invention. The embodiment of FIG. 7 is such that, in FIG. 5A, the drain of the transfer MOST $T_2$ is connected to the line of the power supply $V_D$, the output $O_1$ being applied to the gate of the MOST $T_2$. In the embodiment of FIG. 5A, each time the synchronizing pulses $H_1$ and $H_2$ turn "on", the MOSTs $T_2$ and $T_4$ turn "on", and the charges of the nodes B and C move to under the gates. When the pulses $H_1$ and $H_2$ turn "off", it can occur that some of the charges escape to the substrate and that the potential of the node C shifts towards a positive value to some extent. The embodiment of FIG. 7 avoids this drawback. The operating principle is substantially the same as in the embodiment of FIG. 5A.

Even when the MOSTs $T_1$ and $T_3$ already have varactor capacitances consisting of parasitic capacitances, an additional capacitor can be especially disposed as a bootstrap capacitance.

Although the gate of the feedback transistor $T_6$ in FIG. 7 is connected to the node E, the feedback may well be made from the node D.

It is also possible to dispose the reset transistors 61 and 62 at the output points (B, D, F . . . ) as in FIG. 5A.

EMBODIMENT 3

Figure 8:
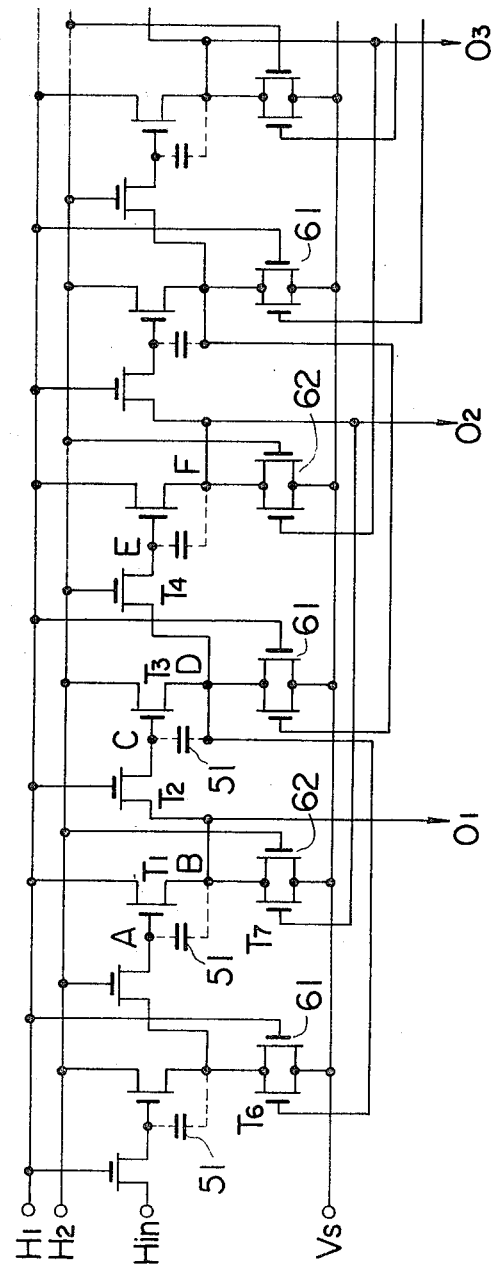
FIG. 8 is a circuit diagram showing a third embodiment of the scanning pulse generator circuit according to this invention.

FIG. 8 shows another embodiment of this invention. This embodiment is such that, in FIG. 5A, the feedback transistor $T_7$ is connected to the node B, not the node C.

In the foregoing embodiments 1 to 3, the outputs $O_1$, $O_2$ and $O_3$ are the pulses which are synchronized with only one of the synchronizing pulses $H_1$ and $H_2$. However, this is not restrictive in case of using the embodiments as ordinary scanning circuits. For example, in FIGS. 5A and 5B, when the pulses $H_1$ and $H_2$ are pulses of an identical shape, output pulses are obtained from the nodes B, D and F. Needless to say, this method of use is applicable to all the embodiments of the present invention.

EMBODIMENT 4

Another type of embodiment of this invention will now be explained.

Figure 9A:
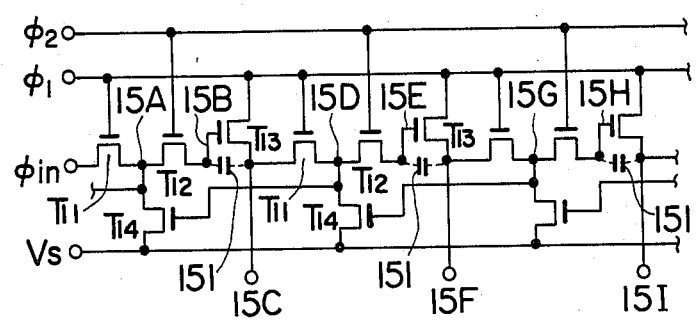
FIG. 9A is a circuit diagram showing a fourth embodiment of the scanning pulse generator circuit according to this invention.
Figure 9B:
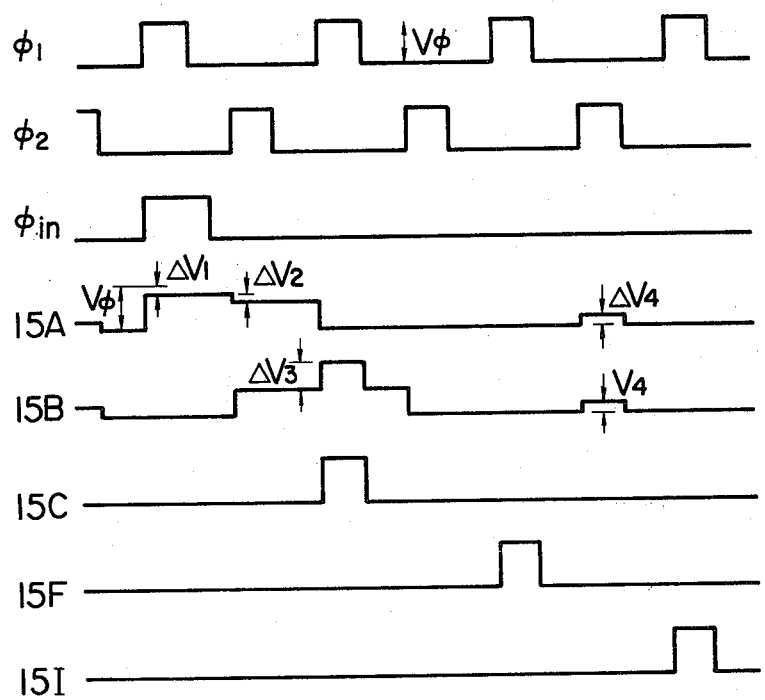
FIG. 9B is a pulse timing chart showing clock pulses, an input and potential changes at various nodes in the circuit of FIG. 9A.

FIGS. 9A and 9B show an embodiment of the scanning circuit of this invention as well as pulse waveforms thereof. A unit circuit (bit) is constructed of four MOSTs, for example, MOSTs $T_{11}$, $T_{12}$, $T_{13}$ and $T_{14}$. FIG. 9B is a timing diagram of an input pulse $\phi_{in}$, driving pulses $\phi_1$ and $\phi_2$, and potentials at nodes 15A and 15B typical of main nodes in FIG. 9A and at nodes 15C, 15F and 15I at which scanning pulses are obtained. As the potentials of nodes 15D and 15E and nodes 15G and 15H, potentials similar to those of the nodes 15A and 15B appear with phase delays of 360° and 720° respectively. A terminal $V_S$ is grounded, but even when it is coupled with the pulse $\phi_1$ a similar effect is achieved (though the potential waveform of the node 15A changes to some extent).

The maximum potential to which the node 15A attains lowers by $\Delta V_1$ due to the threshold voltage $V_{th}$ of the MOST $T_{11}$ and the substrate effect and further lowers by $\Delta V_2$ on account of the charging of the gate capacitance of the MOST $T_{13}$, whereupon the lowered potential is transferred to the node 15B to render the MOST $T_{13}$ conductive. The potential of the node 15B is pushed up by the varactor-like effect (represented by a capacitance 151) on the basis of the pulse $\phi_1$, and rises by $\Delta V_S$. If $\Delta V_S \geq V_{th} + \Delta V_1 + \Delta V_2$, the pulse $\phi_1$ passes through the MOST $T_{13}$ without any change (with the MOST $T_{13}$ being in the non-saturation condition), and it is transferred to the output end, for example, the node 15C.

Owing to the gate electrode capacitance effect of the MOST $T_{12}$, a potential $\Delta V_4$ appears at the nodes 15A and 15B each time the pulse $\phi_2$ becomes positive as illustrated in FIG. 9B, and it renders the MOST $T_{13}$ conductive periodically. At this time, the pulse $\phi_1$ is at the ground level, to execute the reset operation of stabilizing the output end to the ground potential at all times.

When only the threshold voltage of the MOST $T_{14}$ is made higher than those of the other MOSTs, this effect is demonstrated still better.

The scanning circuit of the present embodiment obtains the output pulses from the driving pulse $\phi_1$ only. In addition, it is not affected by deviations in the characteristics of the respective MOSTs, particularly the threshold voltages of the MOSTs $T_{13}$, etc., and it is free from decay, so that the uniformity is remarkably improved. Moreover, the required power is conspicuously low, and the driver MOST being large disproportionately to the load as otherwise required for the inverter circuit is unnecessary, so that the embodiment is especially suited to a high degree of integration.

In order to more intensify the reset operation in the scanning circuit of FIG. 9A, a MOST $T_{15}$ which connects the $\phi_1$ line and the output end by the use of the pulse $\phi_2$ may be disposed in parallel with the MOST $T_{13}$. Even when the drain of the MOST $T_{15}$ is connected to the grounding terminal $V_S$ instead of the $\phi_1$ line, a similar effect is achieved.

When a MOST $T_{16}$ whose source and drain are connected to the $\phi_2$ line and whose gate is connected to the node between the MOSTs $T_{11}$ and $T_{12}$ is added, it demonstrates a varactor-like effect similar to that of the MOST $T_{13}$, eliminates $\Delta V_2$ to be lowered by the charging of the gate capacitance of the MOST $T_{13}$ and simplifies design conditions.

Needless to say, when the above two measures are combined, that is, the MOSTs $T_{15}$ and $T_{16}$ are disposed, both the effects are simultaneously attained. By disposing a capacitive element in parallel besides the varactor-like capacitance 151 of the MOST $T_{13}$ shown in FIG. 9A, $\Delta V_3$ can be made greater. This is equivalent to increasing the capacitance 23 in FIG. 2B and FIG. 3B. It goes without saying that the same effect is achieved in any of the embdiments.

EXAMPLE 5

Figure 10A:
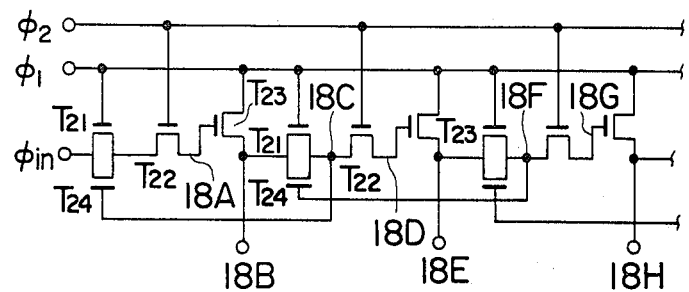
FIG. 10A is a circuit diagram showing a fifth embodiment of the scanning pulse generator circuit according to this invention.
Figure 10B:
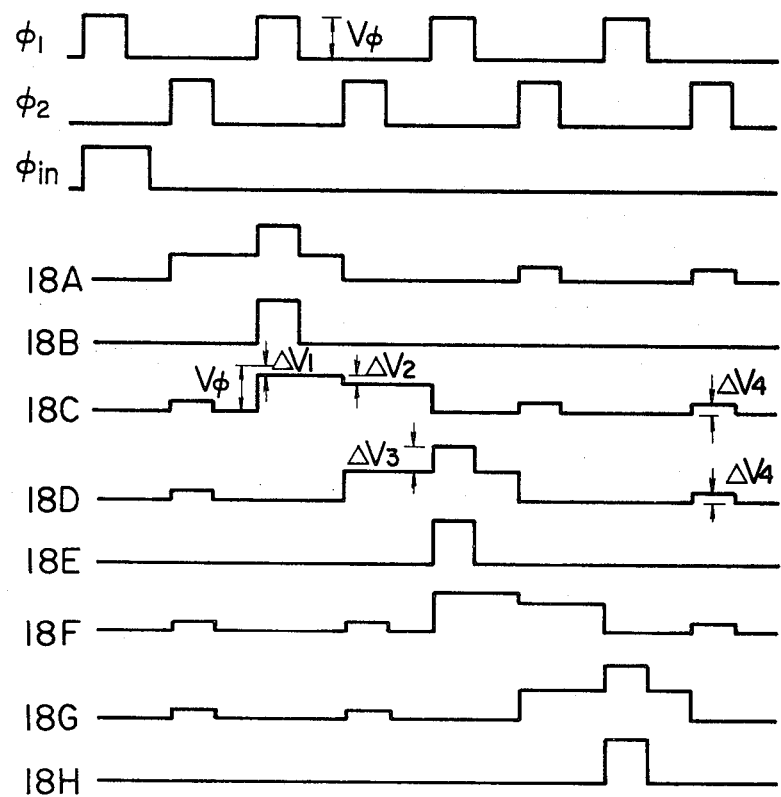
FIG. 10B is a pulse timing chart showing clock pulses, an input pulse and potential changes at various nodes in the circuit of FIG. 10A.

FIGS. 10A and 10B show another type of embodiment of the scanning circuit according to this invention. Four MOSTs, for example, MOSTs $T_{21}$, $T_{22}$, $T_{23}$ and $T_{24}$ constitute a unit circuit (stage). A timing diagram of an input pulse $\phi_{in}$, driving pulses $\phi_1$ and $\phi_2$, and potentials at nodes 18A–18H typical of main nodes in FIG. 10A is shown in FIG. 10B.

The maximum potential to which, for example, the node 18C attains lowers by $\Delta V_1$ due to the threshold voltage $V_{th}$ of the MOST $T_{21}$ and the body effect and further lowers by $\Delta V_2$ on account of the charging of the gate capacitance of the MOST $T_{23}$, whereupon the lowered potential is transferred to the node 18D to render the MOST $T_{23}$ conductive. the potential of the node 18D is pushed up by the varator-like effect on the basis of the pulse $\phi_1$, and rises by $\Delta V_3$. If $\Delta V_3 \geqq V_{th} + \Delta V_1 + \Delta V_2$, the pulse $\phi_1$ passes through the MOST $T_{23}$ without any change (with the MOST $T_{23}$ being in the non-saturation condition), and it is transferred to the output end or the node 18E.

Owing to the gate electrode capacitance effect of the MOST $T_{23}$, a potential $\Delta V_4$ appears at the nodes 18C and 18D each time the pulse $\phi_2$ becomes positive as illustrated in FIG. 10B, and it renders the MOST $T_{23}$ conductive periodically. At this time, the pulse $\phi_1$ is at the ground level, to execute the reset operation of stabilizing the output end to the ground potential at all times. When only the threshold voltage of the MOST $T_{24}$ is made higher than those of the other MOSTs, this effect is demonstrated still better.

In order to more intensify the reset operation in the scanning circuit of FIG. 10A, a MOST $T_{25}$ which connects the $\phi_1$ line and the output end by the use of the pulse $\phi_2$ can be disposed in parallel with the MOST $T_{23}$. Even when the drain of the MOST $T_{25}$ is connected to the ground instead of the $\phi_1$ line, a similar effect is achieved.

Further, when a MOST $T_{26}$ whose source and drain are connected to the $\phi_2$ line and whose gate is connected to the node between the MOSTs $T_{21}$ and $T_{22}$ is added to the scanning circuit of FIG. 10A, it demonstrates a varactor-like effect similar to that of the MOST $T_{23}$, eliminates $\Delta V_2$ to be lowered by the charging of the gate capacitance of the MOST $T_{23}$ and relieves restrictions on design.

Of course, when the above two measures are combined, that is, the MOSTs $T_{25}$ and $T_{26}$ are disposed, both the effects are simultaneously achieved. By disposing an additional capacitance in parallel with the varactor-like capacitance of the MOST $T_{23}$ shown in FIG. 10A, $\Delta V_3$ can be made greater. This is equivalent to increasing the capacitance 23 in FIG. 2B and FIG. 3B. Needless to say, the same effect is achieved in any of the embodiments.

EMBODIMENT 6

Figure 11A:
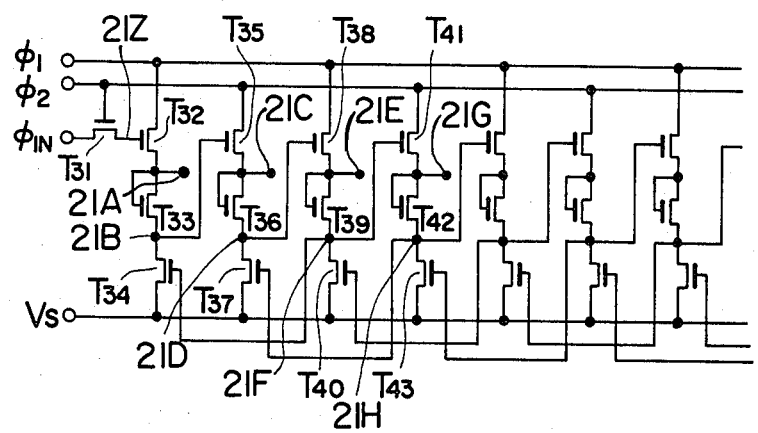
FIG. 11A is a circuit diagram showing a sixth embodiment of the scanning pulse generator circuit according to this invention.
Figure 11B:
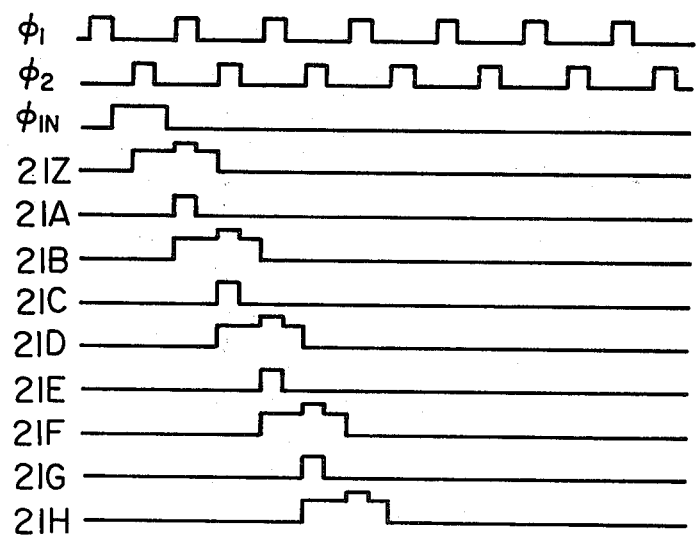
FIG. 11B is a pulse timing chart showing clock pulses, an input pulse and potential changes at various nodes in the circuit of FIG. 11A.

FIG. 11A shows another embodiment of the scanning circuit of this invention. FIG. 11B shows voltage waveforms at various nodes in FIG. 11A. The operation of this scanning circuit will be briefly described. In the circuit of FIG. 11A, when an input pulse $\phi_{IN}$ is applied, a MOS transistor (hereinbelow, abbreviated to "MOST") $T_{31}$ is turned "on" by a clock pulse $\phi_2$, and charges are stored in a node 21Z (gate of a MOST $T_{32}$). Subsequently, when a clock pulse $\phi_1$ becomes a high level ("H"), a node 21A becomes "H", and also a MOST $T_{33}$ turns "on" to make a node 21B "H". When the clock pulse $\phi_1$ becomes a low level ("L"), the potential of the node 21A becomes "L", but the node 21B remains at "H" owing to the diode characteristic of the MOST $T_{33}$. The potential of the node 21B is the same as the potential of the gate of a MOST $T_{35}$. When the clock pulse $\phi_2$ becomes "H", also nodes 21C and 21D become "H". When the clock $\phi_2$ becomes "L" again, the potential of the node 21C becomes "L", whereas the potential of the node 21D remains at "H". Voltages are similarly transmitted to nodes 21E, 21F, 21G and 21H. When the potential of the node 21F becomes "H", the gate of a MOST $T_{34}$ becomes "H" and this MOSFET falls into the "on" state, and the potential of the node 21B is reset to $V_{SS}$ or "L".

As seen from FIG. 11B, as the outputs of the scanning circuit there can be obtained a train of narrow pulses 21A, 21C, 21E, 21G, ... (spaced pulses) and a train of broad pulses 21B, 21D, 21F, 21H, ... The pulse amplitude of the pulses 21A, 21C, 21E, 21G, ... is quite the same as the pulse amplitude of the pulse $\phi_1$ (or $\phi_2$) owing to the bootstrap effect based on the gate-channel capacitances of the MOSTs $T_{32}$, $T_{35}$, $T_{38}$ ....

The power dissipation takes place only in the stage to which the input pulse is transmitted, and it requires only to charge the load, so that it becomes very low.

As apparent from the above description, the scanning pulse generator circuit of the present embodiment consists of three MOSTs per stage. For example, the MOSTs $T_{32}$, $T_{33}$ and $T_{34}$ constitute one stage (basic circuit); and the drain of the MOST T$_{32}$ serves as a clock pulse-applying terminal, the gate of the MOST T$_{32}$ as an input terminal of the basic circuit, the node 21A as a scanning pulse output terminal, the node 21B as an output terminal of the basic circuit (it may also serve as the scanning pulse output terminal), the gate of the MOST T$_{34}$ as a feedback input terminal, and the source of the MOST T$_{34}$ as a ground terminal.

Figure 12:
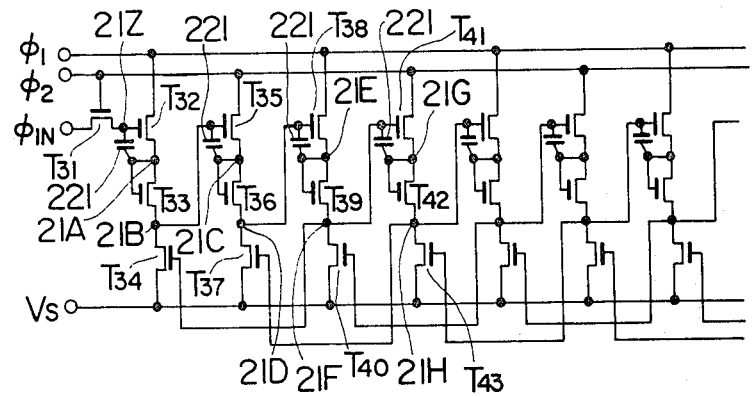
FIGS. 12 through 18 are circuit diagrams each showing a modification of the scanning pulse generator circuit shown in FIG. 11A.

A modification of the present embodiment is shown in FIG. 12. This modification is such that, in order to intensify the bootstrap effects of the MOSTs T$_{32}$, T$_{35}$, T$_{38}$ and T$_{41}$ in FIG. 11A, additional capacitances 221 are disposed between the gates and sources.

Figure 13:
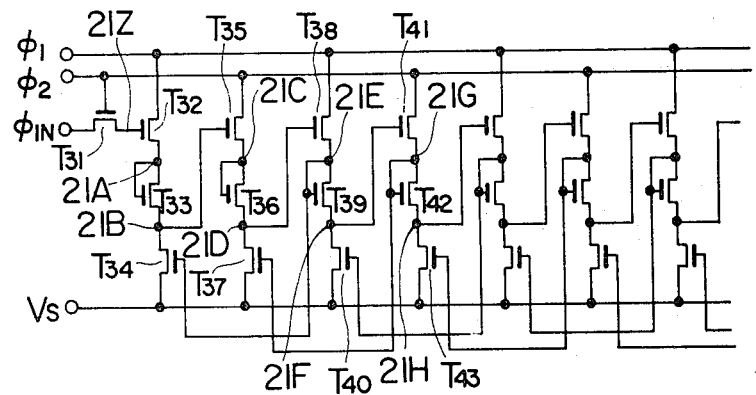

FIG. 13 shows another modification, in which in order to reset the potentials of the nodes 21B, 21D, . . . into "L", signals are fed back from the nodes 21E, 21G, . . . to the gates of the MOSTs T$_{34}$, T$_{37}$, . . . (the modification differs from the embodiment of FIG. 11A in only the place of feedback).

Figure 14:
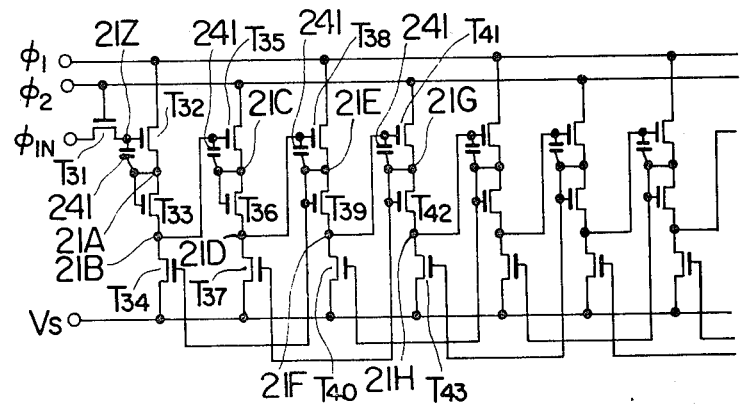

FIG. 14 shows another modification, in which additional capacitances 241 for intensifying the bootstrap effects are disposed between the gates and sources of the MOSTs T$_{32}$, T$_{35}$, . . . in the embodiment of FIG. 13.

Figure 15:
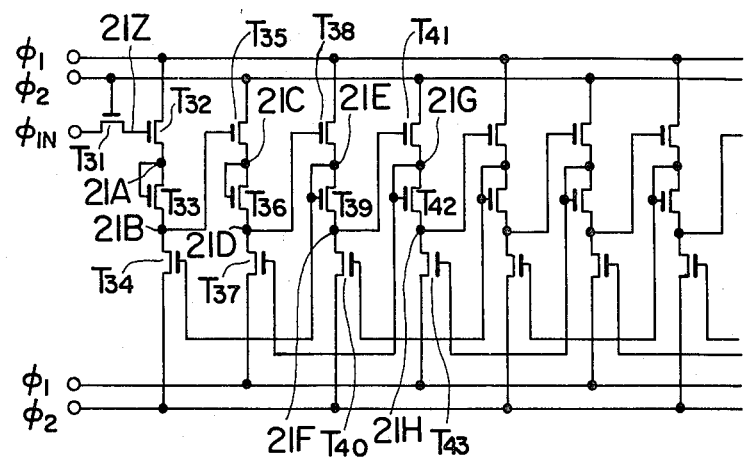

FIG. 15 shows another modification. The sources of the resetting transistors T$_{34}$, T$_{37}$, T$_{40}$ . . . are connected to the $\phi_1$ and $\phi_2$ lines.

Figure 16:
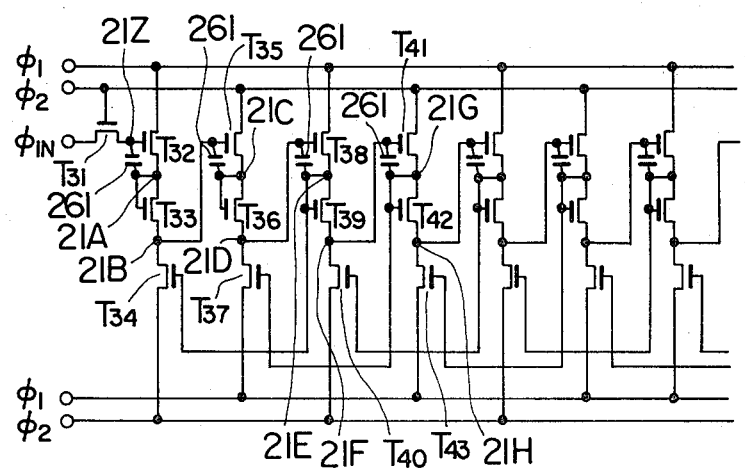

FIG. 16 shows another example, in which additional capacitances 261 for intensifying the bootstrap effects are disposed in the circuit arrangement of FIG. 15.

Figure 17:
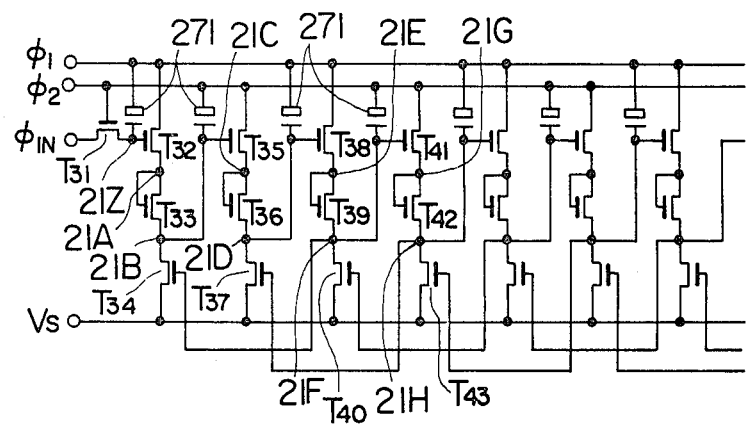

FIG. 17 shows another example. MOS varactors 271 are added to the embodiment of FIG. 11A, and they have the property that only when the gates are at "H", the capacitances are large. By way of example, if the potential of the node 21B is "H", the gate of the MOST T$_{35}$ becomes sufficiently "H" owing to the capacitance 271, and if the potential is "L", the capacitance 271 is small and has no evil effect. The MOS varactors can also be added to the examples of FIGS. 12–16.

Figure 18:
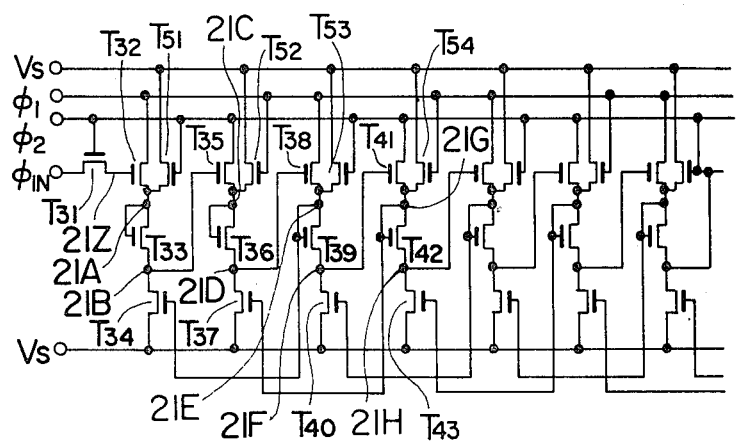

FIG. 18 shows another modification. In order to make more perfect the "L" potentials of the nodes 21A, 21C, 21E, 21G, . . . of the scanning circuit in FIG. 13, MOSTs T$_{51}$, T$_{52}$, T$_{53}$, T$_{54}$, . . . are added. These MOSTs for the perfect resetting can also be added to the examples of FIG. 11A, FIG. 12, and FIGS. 14 to 17.

Timing diagrams for the circuits of FIGS. 12 to 18 are the same as FIG. 11B.

Features of the present embodiments are summarized below.

(i) Three MOSTs/stage suffice, and the density of integration is enhanced. (However, four MOSTs/stage in the embodiment of FIG. 18)

(ii) With six MOSTs/stage, output pulses synchronized with only $\phi_1$ (or $\phi_2$) are obtained, and the non-uniformity of the output pulses are remarkably reduced.

(iii) When the nodes 21A, 21C, 21E, 21G, . . . are employed as output terminals, the amplification of the output pulses is quite the same as that of $\phi_1$ (or $\phi_2$), the V$_{TH}$ drop due to MOSTs does not occur.

(iv) Regarding the output pulse widths, one equal to the clock pulse width (narrow pulse width) and the clock pulse period (board pulse width) are obtained.

(v) Inferior parasitic effects (charge pumping etc.) in the case of the IC form do not occur.

(vi) The power dissipation is very low.

(vii) In order to operate the scanning circuit, only $\phi_1$, $\phi_2$, $\phi_{IN}$ and V$_{SS}$(GND) are required, and V$_{DD}$ is unnecessary.

Figure 19A:
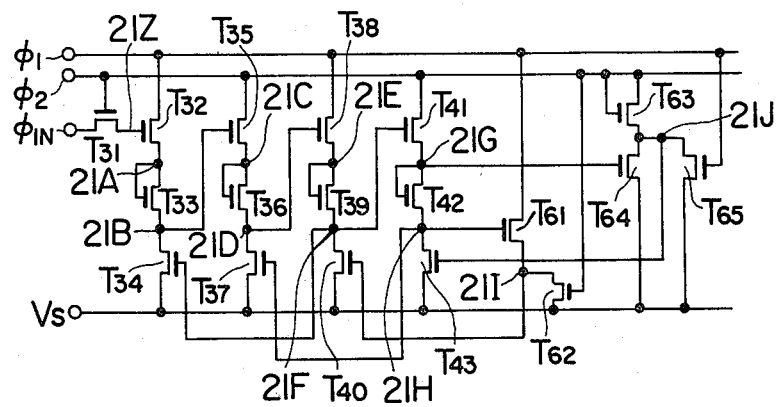
FIG. 19A is a circuit diagram showing a terminating circuit of the scanning pulse generator circuit shown in FIG. 11A.
Figure 19B:
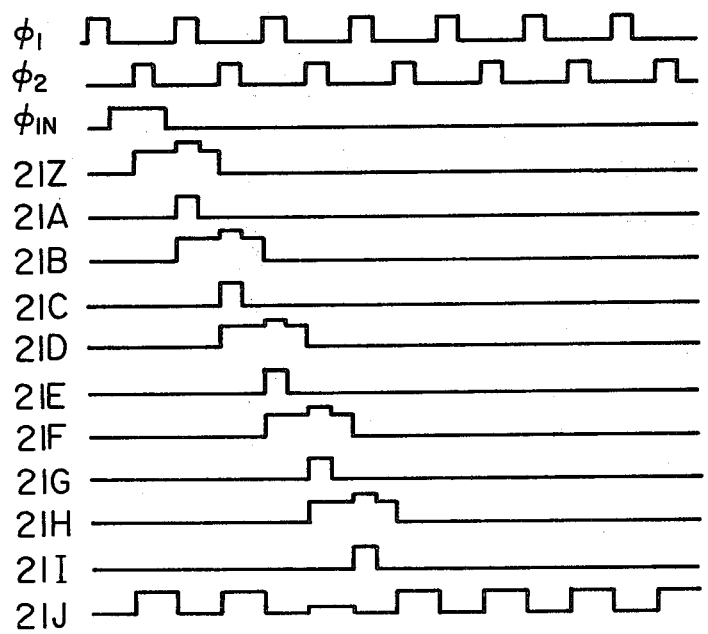
FIG. 19B is a pulse timing chart showing clock pulses, an input pulse and potential changes at various nodes in the circuit of FIG. 19A.

FIG. 19A shows a terminating circuit of the above scanning circuits, while FIG. 19B shows clock pulses, an input pulse and potential variations at various nodes.

The circuit is such that MOSTs T$_{61}$, T$_{62}$, T$_{63}$, T$_{64}$ and T$_{65}$ are connected to the embodiment of FIG. 11A.

The potential of a node 21F is reset only when the potential of a node 21H is "H", and by a pulse 21I synchronized with $\phi_1$ by the MOST T$_{61}$. The potential of a node 21H is reset only when the potential of a node 21G is "L", and by a pulse 21J synchronized with $\phi_2$ by the MOST T$_{63}$. The g$_m$ ratio between the MOSTs T$_{63}$ and T$_{64}$ may be set at g$_{m\cdot 64}$/g$_{m\cdot 63}$=8 or so. The MOST T$_{62}$ need not be specially disposed, but it is incorporated in order to make the operation reliable.

What is claimed is:

1. A circuit for generating scanning pulses comprising a plurality of stages of basic circuits connected in series, said each basic circuit comprising first, second and third insulated gate field-effect transistors (MISTs) each of which has first and second terminals each being either of source and drain terminals and a gate terminal, said first terminal of said first MIST being used as a clock pulse-applying terminal, said gate terminal of said first MIST being used as an input terminal, said second terminal of said first MIST and said first terminal and said gate terminal of said second MIST being connected and used as a scanning pulse output terminal, said second terminal of said second MIST and said first terminal of said third MIST being connected and used as an output terminal, said second terminal of said third MIST being used as a ground terminal, said gate terminal of said third MIST being used as a feedback input terminal.

2. A circuit for generating scanning pulses as defined in claim 1, wherein said feedback input terminal is connected to the output terminal of the basic circuit which is two stages posterior.

3. A circuit for generating scanning pulses as defined in claim 1, wherein said feedback input terminal is connected to the scanning pulse output terminal of the basic circuit which is two stages posterior.

4. A circuit for generating scanning pulses as defined in claim 1, wherein the clock pulse-applying terminals of the basic circuits of odd stages have a first clock pulse applied thereto, and the clock pulse-applying terminals of the basic circuits of even stages have a second clock pulse applied thereto.

5. A circuit for generating scanning pulses as defined in claim 1, wherein said first MIST has between said gate terminal and said second terminal a bootstrap capacitance which consists of parasitic capacitances.

6. A circuit for generating scanning pulses as defined in claim 1, wherein said first MIST has an external capacitance connected between said gate terminal and said second terminal.

7. A circuit for generating scanning pulses as defined in claim 1, wherein the ground terminals of the respective basic circuits are connected to a ground line in common.

8. A circuit for generating scanning pulses as defined in claim 1 or claim 4, wherein the ground terminals of the basic circuits of odd stages have the second clock pulse applied thereto, and the ground terminals of the basic circuits of even stages have the first clock pulse applied thereto.

9. A circuit for generating scanning pulses as defined in claim 1, further comprising a MIS varactor whose first and second terminals, and gate terminal are respectively connected to said first terminal, and said gate terminal of said first MIST.

10. A circuit for generating scanning pulses as defined in claim 1, further comprising a fourth MIST whose drain is connected to said scanning pulse output terminal, whose source is connected to a ground line and whose gate has a clock pulse applied thereto.

11. A circuit for generating scanning pulses comprising a plurality of stages of basic circuits connected in series, said each basic circuit comprising first, second and third insulated gate field-effect transistors (MISTs) each of which has first and second terminals each being either of source and drain terminals and a gate terminal, said first terminal of said first MIST being used as a clock pulse-applying terminal, said gate terminal of said first MIST being used as an input terminal, said second terminal of said first MIST and said first terminal of said second MIST being connected and used as a scanning pulse output terminal, said gate terminal of said second MIST being connected to said clock pulse-applying terminal, said second terminal of said second MIST being used as an output terminal, said first terminal of said third MIST being connected to either of said scanning pulse output terminal and said output terminal, said second terminal of said third MIST being used as a ground terminal, said gate terminal of said third MIST being used as a feedback input terminal.

12. A circuit for generating scanning pulses as defined in claim 11, wherein said feedback input terminal is connected to either of the scanning pulse output terminal and the output terminal of the basic circuit which is two stages posterior.

13. A circuit for generating scanning pulses as defined in claim 11, wherein the clock pulse-applying terminals of the basic circuits of odd stages have a first clock pulse applied thereto, and the clock pulse-applying terminals of the basic circuits of even stages have a second clock pulse applied thereto.

14. A circuit for generating scanning pulses as defined in claim 11, wherein said first MIST has between said gate terminal and said second terminal a bootstrap capacitance which consists of parasitic capacitances.

15. A circuit for generating scanning pulses as defined in claim 11, wherein said first MIST has an additional capacitance connected between said gate terminal and said second terminal.

16. A circuit for generating scanning pulses as defined in claim 11, further comprising a fourth MIST whose drain is connected to said scanning pulse output terminal, whose source is connected to a ground line and whose gate has a clock pulse applied thereto.

17. A circuit for generating scanning pulses as defined in claim 11, wherein a first terminal of a fifth MIST whose gate has a clock pulse applied thereto is connected to said output terminal of said basic circuit, and a second terminal of said fifth MIST is connected to the input terminal of the basic circuit of the succeeding stage.

18. A circuit for generating scanning pulses as defined in claim 17, wherein said feedback input terminal is connected to the output terminal of the basic circuit of the succeeding stage.

19. A circuit for generating scanning pulses as defined in claim 18, wherein said ground terminal is connected to said scanning pulse output terminal.

20. A circuit for generating scanning pulses as defined in claim 11, wherein the ground terminals of the respective basic circuits are connected to a ground line in common.

21. A circuit for generating scanning pulses comprising a plurality of stages of basic circuits connected in series, said each basic circuit comprising first, second and third insulated gate field-effect transistors (MISTs) each of which has first and second terminals each being either of source and drain terminals and a gate terminal, said first terminal of said first MIST being used as a clock pulse-applying terminal, said gate terminal of said first MIST being used as an input terminal, said second terminal of said first MIST and said gate terminal of said second MIST being connected and used as a scanning pulse output terminal, said first terminal of said second MIST being used as a power supply terminal, said second terminal of said second MIST being used as an output terminal, said first terminal of said third MIST being connected to either of said scanning pulse output terminal and said output terminal, said second terminal of said third MIST being used as a ground terminal, said gate terminal of said third MIST being used as a feedback input terminal.

22. A circuit for generating scanning pulses as defined in claim 21, wherein said feedback input terminal is connected to either of the scanning pulse output terminal and the output terminal of the basic circuit which is two stages posterior.

23. A circuit for generating scanning pulses as defined in claim 21, wherein the clock pulse-applying terminals of the basic circuits of odd stages have a first clock pulse applied thereto, and the clock pulse-applying terminals of the basic circuits of even stages have a second clock pulse applied thereto.

24. A circuit for generating scanning pulses as defined in claim 21, wherein said first MIST has between said gate terminal and said second terminal a bootstrap capacitance which consists of parasitic capacitances.

25. A circuit for generating scanning pulses as defined in claim 21, wherein said first MIST has an additional capacitance connected between said gate terminal and said second terminal.

26. A circuit for generating scanning pulses as defined in claim 21, further comprising a fourth MIST whose drain is connected to said scanning pulse output terminal, whose source is connected to a ground line and whose gate has a clock pulse applied thereto.

27. A circuit for generating scanning pulses as defined in claim 21, wherein the power supply terminals of the respective basic circuits are connected to a power supply line in common, and the ground terminals are connected to a ground line in common.

28. A circuit for generating scanning pulses as defined in claim 1, 11 or 21, wherein scanning pulses are derived from the scanning pulse output terminals of the basic circuits of every second stage.

29. A circuit for generating scanning pulses as defined in claim 1, 11 or 21, further comprising an input MIST, a first terminal of said input MIST being used as an input pulse-applying terminal, a second terminal of said input MIST being connected to the input terminal of the basic circuit of the first stage, a gate terminal of said input MIST being used as a clock pulse-applying terminal.

* * * * *